(12) United States Patent
Willaims et al.

(10) Patent No.: US 8,497,565 B2
(45) Date of Patent: Jul. 30, 2013

(54) MULTIPLE ELECTRODE LAYER BACKEND STACKED CAPACITOR

(75) Inventors: Byron Lovell Willaims, Plano, TX (US); Maxwell Walthour Lippitt, III, Rockwall, TX (US); Betty Mercer, Plano, TX (US); Scott Montgomery, Rowlett, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 346 days.

(21) Appl. No.: 13/043,066

(22) Filed: Mar. 8, 2011

(65) Prior Publication Data

US 2011/0156209 A1 Jun. 30, 2011

Related U.S. Application Data

(62) Division of application No. 12/029,798, filed on Feb. 12, 2008, now Pat. No. 7,902,033.

(51) Int. Cl.
*H01L 21/02* (2006.01)

(52) U.S. Cl.
USPC ............. 257/532; 438/393; 257/E21.008; 257/528; 257/306; 257/307; 257/308; 257/309

(58) Field of Classification Search
USPC .............. 257/532, 535, 528, 306–309, 758
See application file for complete search history.

(56) References Cited

U.S. PATENT DOCUMENTS

| | | | |
|---|---|---|---|
| 7,067,869 B2 | 6/2006 | Cheng et al. | |
| 2006/0086963 A1* | 4/2006 | Wu | 257/306 |
| 2007/0235790 A1* | 10/2007 | Kim et al. | 257/306 |

* cited by examiner

*Primary Examiner* — Eva Yan Montalvo
(74) *Attorney, Agent, or Firm* — Warren L. Franz; Wade J. Brady, III; Frederick J. Telecky, Jr.

(57) ABSTRACT

In a disclosed embodiment, a stacked capacitor (100) has bottom, middle and top metal electrode layers (141A, 141B, 141C) interleaved with dielectric layers (142A, 142B) conformally disposed within holes (140A, 140B, 140C) in a protective overcoat or backend dielectric layer (110) over a top metal layer (115) of an integrated circuit (105). A top electrode (155) contacts the top metal electrode layer (141C). A bottom electrode (150) electrically couples an isolated part of the top metal electrode layer (141C) through a bottom electrode via (165A) to a first contact node (135A) in the top metal layer (115) which is in contact with the bottom metal electrode layer (141A). A middle electrode (160) electrically couples a part of the middle metal electrode layer (141B) not covered by the top metal layer (115) through a middle electrode via (165B) to a second contact node (135B) in the top metal electrode layer (115). The sidewalls of the top and middle electrode vias (165A, 165B) are lined with insulating material to electrically isolate the metal electrode layer ends.

18 Claims, 10 Drawing Sheets

MULTIPLE ELECTRODE LAYER BACKEND STACKED CAPACITOR

This is a division of application Ser. No. 12/029,798 filed Feb. 12, 2008 (now U.S. Pat. No. 7,902,033), the entirety of which is incorporated herein by reference.

DESCRIPTION OF THE RELATED ART

This invention relates generally to semiconductor devices, more particularly to methods and devices for a high-k stacked capacitor.

Capacitors are basic energy storage devices, which are used in a wide variety of devices such as in random access memory devices, analog applications, etc. Capacitors typically consist of two conductors, such as parallel metal or polysilicon plates, which act as the electrodes (i.e., the storage node electrode and the cell plate capacitor electrode), insulated from each other by a dielectric material.

The continuous shrinkage of microelectronic devices such as capacitors and gates over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material with silicon to construct microelectronic devices. However, when the $SiO_2$ layer is thinned to 1 nm (i.e., a thickness of only 4 or 5 molecules), as is desired in the newest micro devices, the layer no longer effectively performs as an insulator due to a tunneling current.

Thus, new high dielectric constant, k, materials are needed to extend device performance. Such materials need to demonstrate high permittivity, barrier height to prevent tunneling, stability in direct contact with silicon, and good interface quality and film morphology. However, even with the new high-k dielectric materials, the need to increase device density, such as capacitors, is a constant need especially for active integrated circuits (e.g., power management, baseband, etc.).

SUMMARY

An embodiment generally relates to a method forming capacitors. The method includes forming a plurality of holes within one of a protective overcoat and backend dielectric layer of an integrated circuit and depositing multiple layers of metal, where each layer of metal is electrically tied to an associated electrode. The method also includes alternately depositing multiple layers of dielectric between the multiple layers of metal and coupling a bottom layer of the multiple layers of metal to a contact node in a top metal layer of the integrated circuit.

Another embodiment pertains generally to a semiconductor device. The semiconductor device includes an integrated circuit and a stacked capacitor formed within one of a protective overcoat and backend dielectric layer of the integrated circuit. An electrode of the stacked capacitor is electrically coupled to a contact node in a top metal layer of the integrated circuit.

BRIEF DESCRIPTION OF THE DRAWINGS

Various features of the embodiments can be more fully appreciated, as the same become better understood with reference to the following detailed description of the embodiments when considered in connection with the accompanying figures, in which.

DETAILED DESCRIPTION OF EMBODIMENTS

For simplicity and illustrative purposes, the principles of the present invention are described by referring mainly to example embodiments thereof. However, one of ordinary skill in the art would readily recognize that the same principles are equally applicable to, and can be implemented in, all types of semiconductor processing techniques, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

FIGS. 1A-D share some common features. Accordingly, the description of the common features in later figures is omitted, with the description of these features with respect to earlier figures being relied upon to provide adequate description to the common features.

Figure 1A:
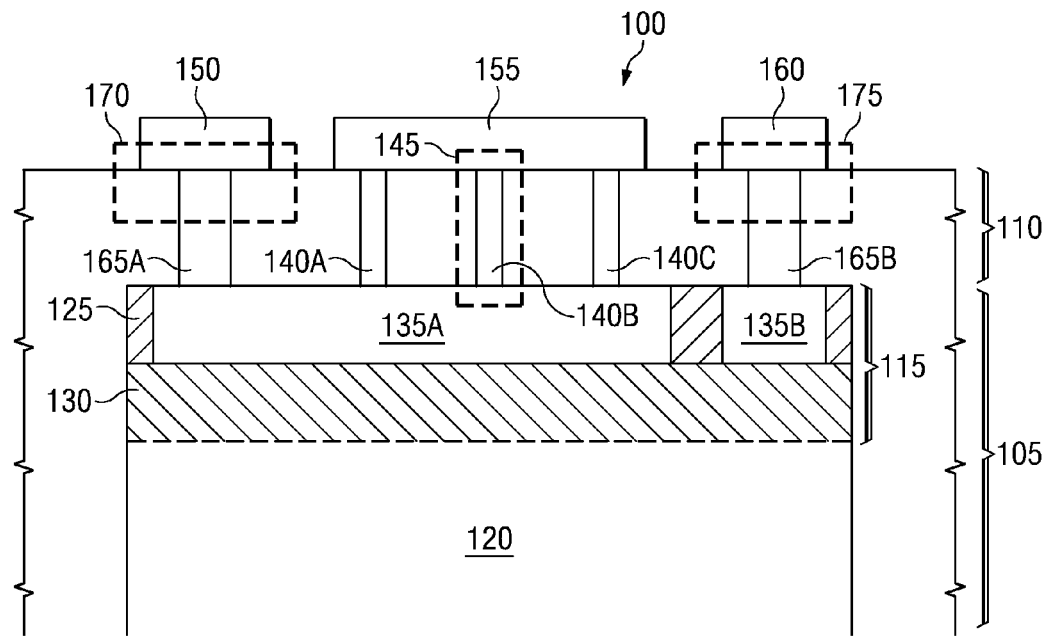
FIG. 1A depicts an example high-k stacked capacitor in accordance with an embodiment.

FIG. 1A depicts an embodiment of the high-k stacked capacitor 100 in accordance with an embodiment. It should be readily apparent to those of ordinary skill in the art that the high-k stacked capacitor 100 depicted in FIG. 1A represents a generalized schematic illustration and that other components may be added or existing components may be removed or modified.

As shown in FIG. 1A, the high-k stacked capacitor 100 can be configured to include an integrated circuit 105 and a protective overcoat or a backend dielectric layer 110 that is deposited over a top metal layer 115 of the integrated circuit 105. The integrated circuit 105 can also include a silicon region 120 where the circuitry (not shown) of the integrated circuit 105 can be implemented by conventional semiconductor processing techniques. The circuitry can be a digital application, analog application or a combination thereof.

The top metal layer 115 can include an inter-metal dielectric region 125 and inter-level dielectric region 130 as well as contact nodes 135A and 135B. The contact nodes 135A and 135B can be electrical conduits for the operation of the high-k stacked capacitor 100. The contact nodes 135A, 135B can be implemented with aluminum (Al) or similar materials as used in the metal layer of the underlying integrated circuit. Although FIG. 1A shows two contact nodes, it should be readily obvious to one of ordinary skill in the art that additional contacts pads could be implemented depending on the number of electrodes desired in the high-k stacked capacitor 100.

Returning to the protective overcoat or the backend dielectric layer 110, the high-k stacked capacitor 100 can further include stack holes 140A-C. Although FIG. 1A depicts a high-k stacked capacitor 100 with three stack holes, more or fewer stack holes can be created depending on the desired performance characteristics. The stack holes 140A-C can each contain layers of metal and high-k dielectric materials that provide the performance characteristics of the high-k stacked capacitor 100. In some embodiments, the diameter of the stack holes 140A-C can be approximately 0.2 μm within a predetermined tolerance. However, as with the number of stack holes, the diameter of the stack hole can be varied dependent on the desired performance characteristics. Inset 145 shows a more detailed view of the stack hole 140B in FIG. 1B.

Figure 1B:
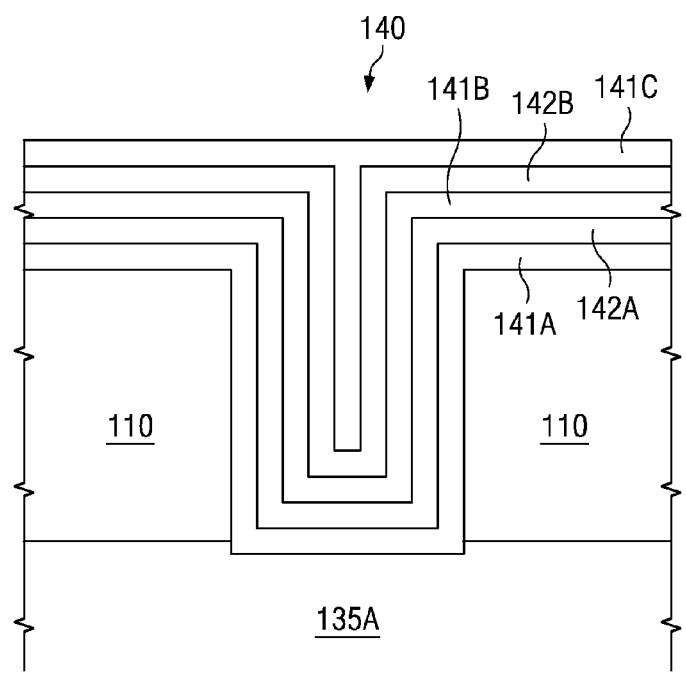
FIG. 1B illustrates a more detailed view of a via of the high-k stacked capacitor in accordance with another embodiment.

As shown in FIG. 1B, the stack hole 140 can comprise the walls of the protective overcoat or the backend dielectric layer 110 and an exposed portion of the contact node 135A. A bottom electrode layer 141A can be deposited in the stack hole 140 followed by a first dielectric layer 142A, a middle electrode layer 141B, a second dielectric layer 142B, and a top electrode layer 141C. The bottom electrode layer 141A follows the contours of the stack hole 140 as do the rest of the subsequent layers. The electrode layers 141A-C can be implemented with materials such as tantalum nitride (TaN), titanium nitride (TiN) or other similar material. The dielectric layers 142A, B can be implemented with the same dielectric material such as $SiO_x$, SiN, $Ta_2O_5$, $HfO_x$, $AlO_x$, PZT, or can be implemented with different dielectric material depending on the desired performance characteristics of the high-k stacked capacitor 100.

In some embodiments, the electrode layers 141A-C can be implemented with the same material and the dielectric layers 142A-B can be implemented with the same dielectric. Other embodiments of the high-k stacked capacitor 100 contemplate implementing the electrode layers 141A-C and the dielectric layers 142A-B with different material on a per layer basis. As a non-limiting example, one embodiment of the high-k stacked capacitor 100 can have an electrode layer 141A of TaN, a dielectric layer 142A of SiOx, an electrode layer 141B of TiN, a dielectric layer 142B of $AlO_x$, and an electrode layer 141C of TaN. Accordingly, the high-k stacked capacitor 100 can be implemented with differing materials for each electrode and dielectric layer depending on the desired performance characteristics.

Returning to FIG. 1A, the high-k stacked capacitor 100 further comprises a bottom electrode 150, a top electrode 155, and a middle electrode 160. The electrodes 150, 160 can be implemented by depositing Al or other similar metal in electrode holes 165A, B. Inset 170, depicted in FIG. 1C, gives a more detailed view of the bottom electrode 150-protective overcoat or backend dielectric layer 110 interface and inset 175, depicted in FIG. 1D, shows a more detailed view of the middle electrode 160-protective overcoat or backend dielectric layer 110 interface.

Figure 1C:
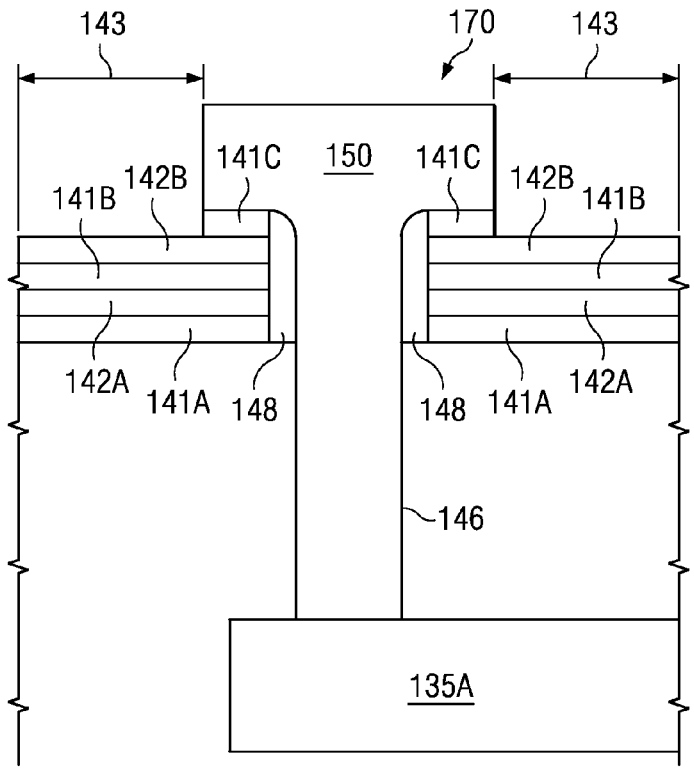
FIG. 1C depicts a more detailed view of an electrode of the high-k stacked capacitor in accordance with yet another embodiment.

Referring to FIG. 1C, the bottom electrode 150 can be electrically coupled (or in electrical contact) with the contact node 135A through an electrode via 146, which is filled with Al, Cu or other material with similar electrical characteristics. Since the bottom electrode 150 can form an electrical circuit with the bottom electrode layer 141A through the contact node 135A, the bottom electrode 150 is electrically isolated from the other electrodes. More specifically, the bottom electrode 150 rests on a part of the top electrode layer 141C. An area 143 of top electrode layer 141C is etched away to expose the second dielectric layer 142B (see FIG. 2I, discussed further below) to create electrical isolation from other parts of top electrode layer 141C and any other electrodes in contact therewith. Insulating sidewalls 148 can also be formed to electrically isolate the ends of the electrode layers 141A-C and dielectric layers 142A-B.

Figure 1D:
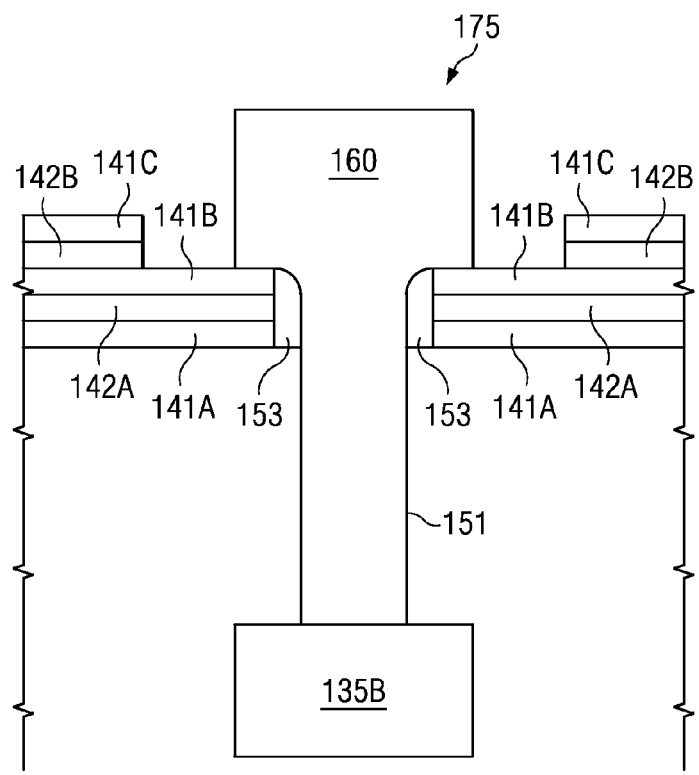
FIG. 1D illustrates a more detailed view of another electrode of the high-k stacked capacitor in accordance with yet another embodiment.

Referring to FIG. 1D, the middle electrode 160 can be electrically coupled to the middle electrode layer 141B as well as second contact node 135B by way of electrode via 151, which is filled with Al in some embodiments. The second contact node 135B can provide an independent ground from the bottom electrode 150, which is grounded to contact node 135A. The top metal layer 141C and second dielectric layer 142B can be etched way from the middle electrode 160 to provide electrical isolation from the top metal layer 141C. The etching of the top metal layer 141C and second dielectric layer 142B can also expose the middle electrode 160 for deposition and attachment of the middle electrode 160.

Sidewalls 153 can be formed on the ends of the metal layers 141A, B and first dielectric layer 142A to electrically isolate the electrode via 151 from the bottom electrode layer 141A. The sidewalls 153 can be implemented with a material such as SiN, SiOx or other material with similar electrical properties to a thickness of approximately 1000 Angstroms. Other embodiments contemplate larger or smaller thickness for the sidewalls 153 depending on the desired performance characteristics.

FIGS. 2A-J illustrate processing steps to produce the high-k stacked capacitor. FIGS. 3A-G i illustrate expanded views of some of the processing steps depicted in FIGS. 2A-J. It should be readily apparent to those of ordinary skill in the art that the processing steps depicted in FIGS. 2A-J and FIGS. 3A-G represent a generalized schematic illustration and that other steps/components may be added or existing steps/components may be removed or modified.

Moreover, FIGS. 2A-J and FIGS. 3A-G share some common features. Accordingly, the description of the common features in later figures is omitted, the description of these features with respect to the earlier figures being relied upon to provide adequate description to the common features.

Figure 2A:
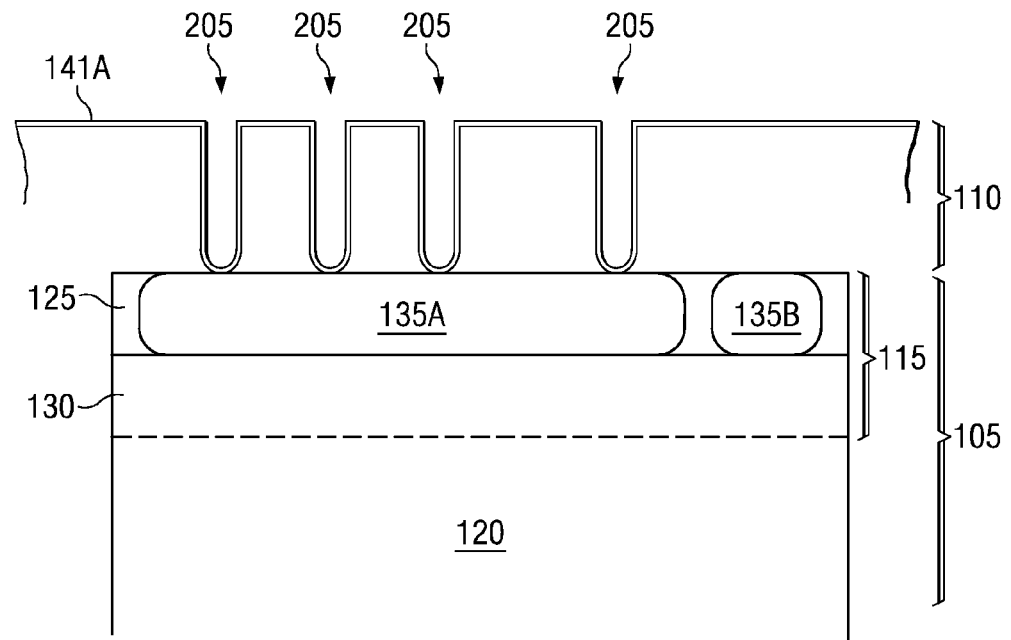
FIGS. 2A-J illustrate example processing steps to implement the high-k stacked capacitor in accordance with yet another embodiment.
Figure 3A:
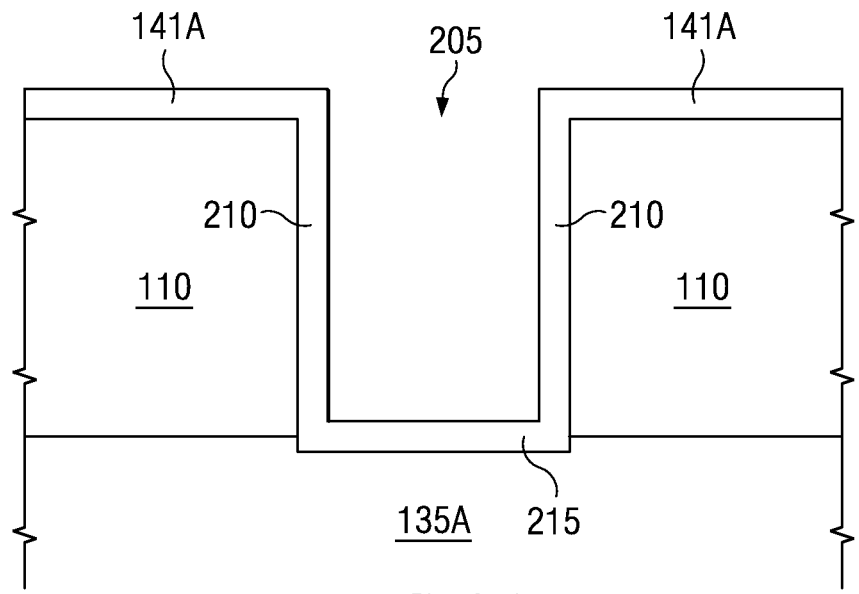
FIGS. 3A-G provide more detailed views of particular processing steps shown in FIGS. 2A-J.
Figure 3B:
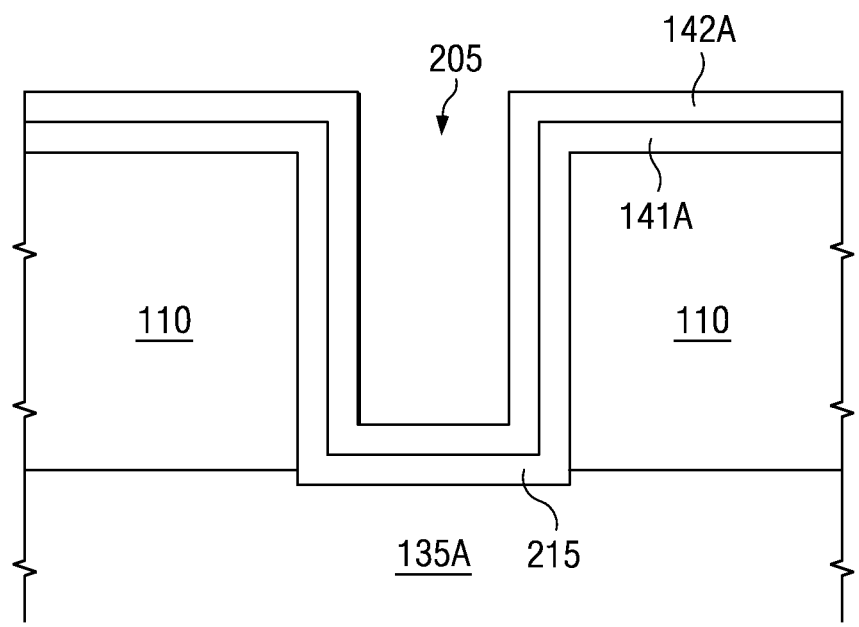

As shown in FIG. 2A, a protective overcoat or backend dielectric layer 110 can be formed on integrated circuit 105. Patterning and etching can then form vias 205 that extend through the protective overcoat or the backend dielectric layer 110 to the contact node 135A in the top metal layer of the integrated circuit 105. Subsequently, a layer of metal (e.g., TiN or TaN) for the bottom electrode (i.e., bottom electrode layer 141A) can be deposited over the protective overcoat or the backend dielectric layer 110. The bottom electrode layer 141A follows the contours of vias 205 as well as the surface of the protective overcoat or the backend dielectric layer 110 and is electrically coupled to the contact node 135A. A more detailed view of one of the vias 205 and the bottom electrode layer 141A is depicted in FIG. 3A. As shown in FIG. 3A, the bottom electrode layer 141A can be deposited such that a metal of substantially uniform thickness of about 200 Angstroms is deposited on the surface of the protective overcoat or backend dielectric layer 110, the walls 210 of via 205, and the bottom 215 of via 205.

Figure 2B:
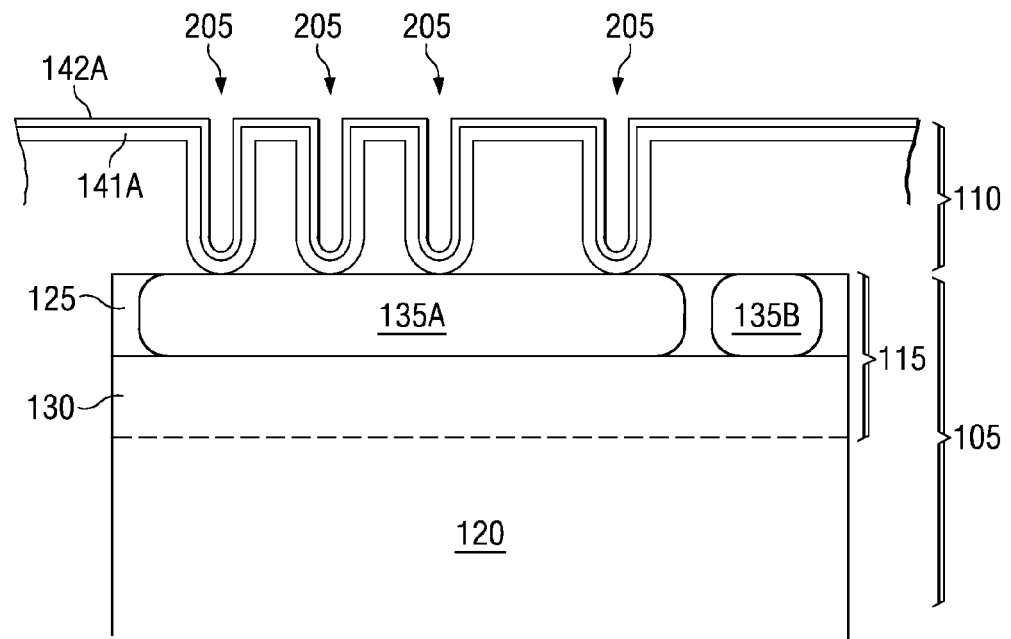

Referring to FIG. 2B, a first dielectric layer 142A can be deposited over the bottom electrode layer 141A to a substantially uniform layer of thickness of about 200 Angstroms. The first dielectric layer 142A can be implemented with a material such as $SiO_x$, SiN, $Ta_2O_5$, $HfO_x$, $AlO_x$, PZT, etc. Similar to the bottom electrode layer 141A, the first dielectric layer 142A follows the contours of via 205, as shown in greater detail in FIG. 3B. As shown in FIG. 3A, the first dielectric layer 142A can be substantially uniformly deposited over the horizontal and vertical portions of the bottom electrode layer 141A, which mimics the contours of via 205.

Figure 2C:
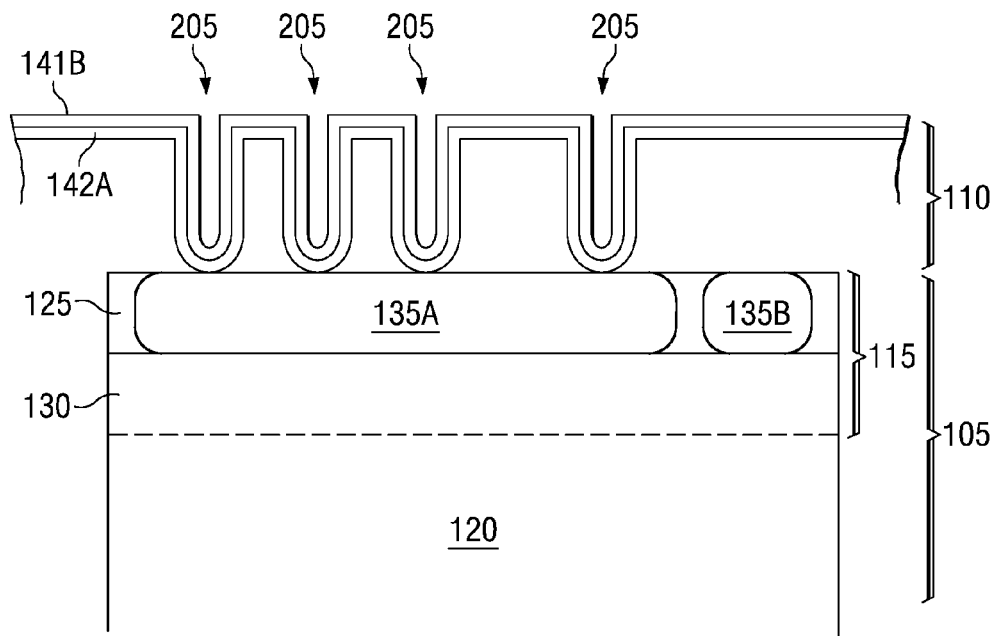
Figure 3C:
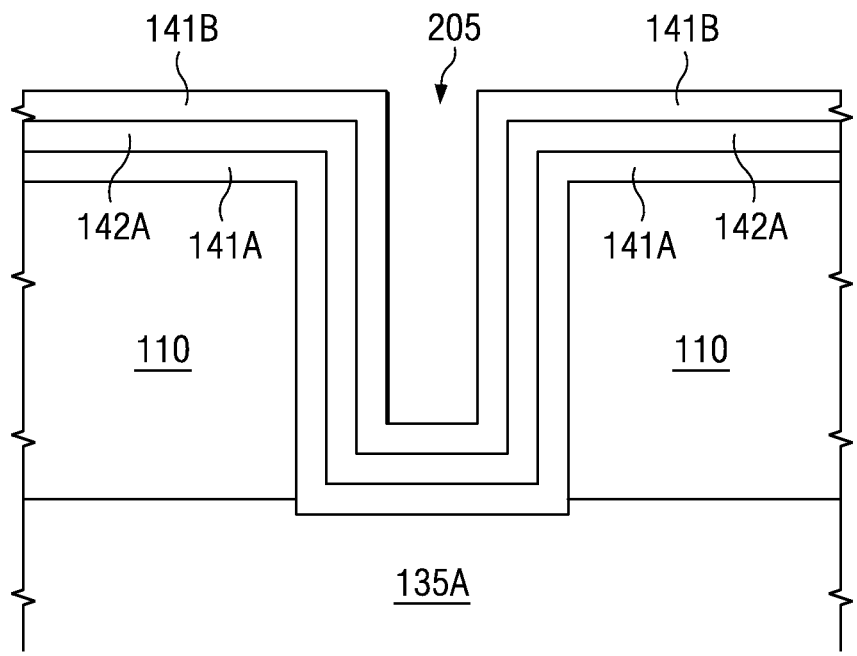

Referring to FIG. 2C, a middle electrode layer 141B can then be deposited over the first dielectric layer 142A with a material such as TiN or TaN. The bottom electrode layer 141A has been omitted for clarity in FIG. 2C. Similar to the first dielectric layer 142A, the middle electrode layer 141B can be a substantially uniform layer of 200 Angstroms that follows the contours of the first dielectric layer 142A. FIG. 3C depicts an expanded view of via 205 after the deposition of the middle electrode layer 141B along with the bottom electrode layer 141A.

Figure 2D:
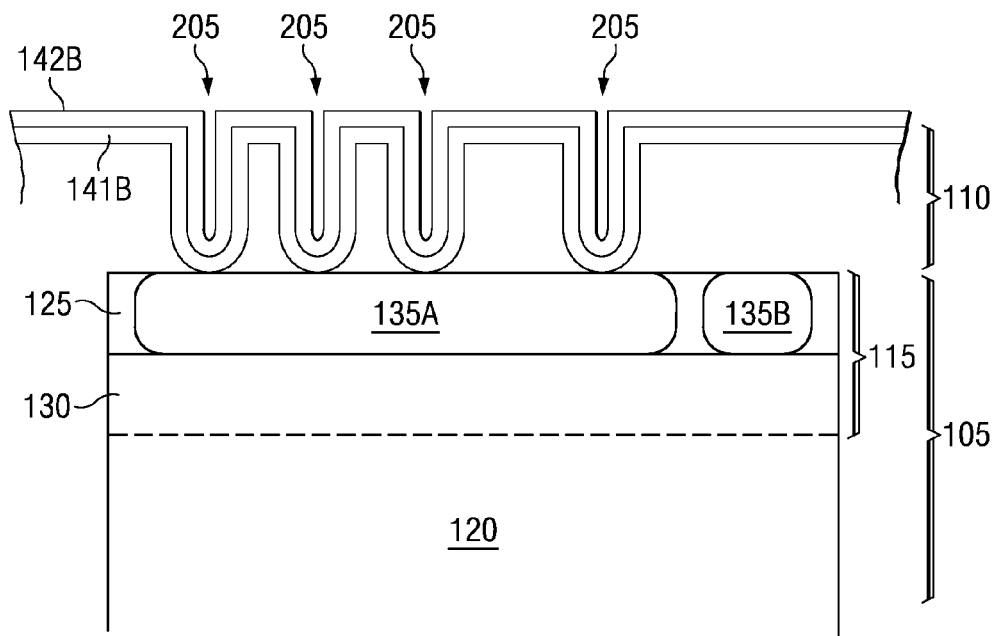
Figure 3D:
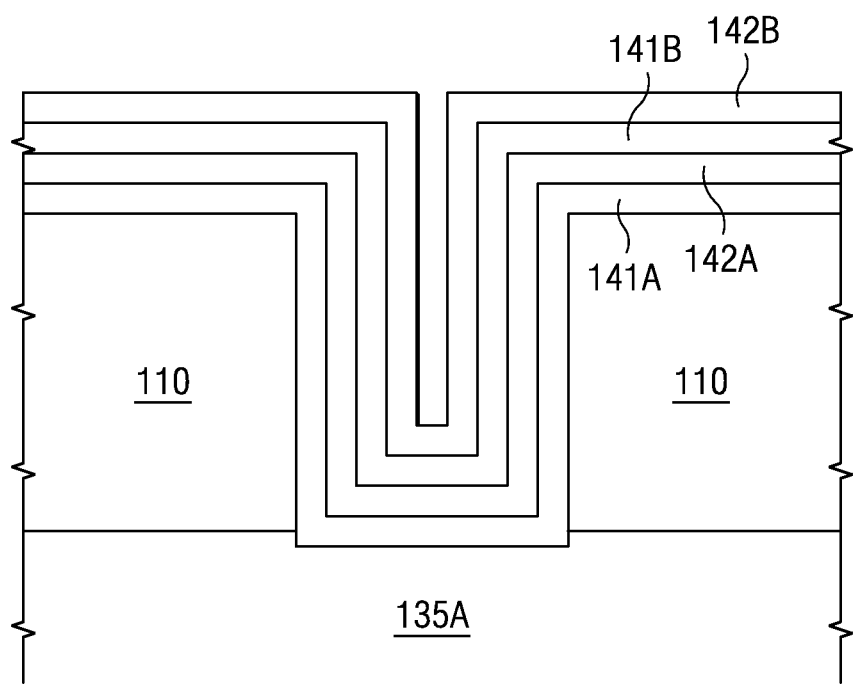

Referring to FIG. 2D, a second dielectric layer 142B can be deposited over the middle electrode layer 141B to a substantially uniform thickness of about 200 Angstroms. The bottom electrode layer 141A and the first dielectric layer 142A has been omitted in FIG. 2D for clarity. The second dielectric layer 142B can be formed of a material such as $SiO_x$, SiN, $Ta_2O_5$, $HfO_x$, $AlO_x$, PZT, etc. Similar to the middle electrode layer 141B, the second dielectric layer 142B follows the contours of via 205, as shown in greater detail in FIG. 3D. As shown in FIG. 3D, the second dielectric layer 142B can be substantially uniformly deposited over the horizontal and vertical portions of the middle electrode layer 141B as well as of the bottom electrode 141A and the first dielectric layer 142A, which mimics the contours of via 205.

Figure 2E:
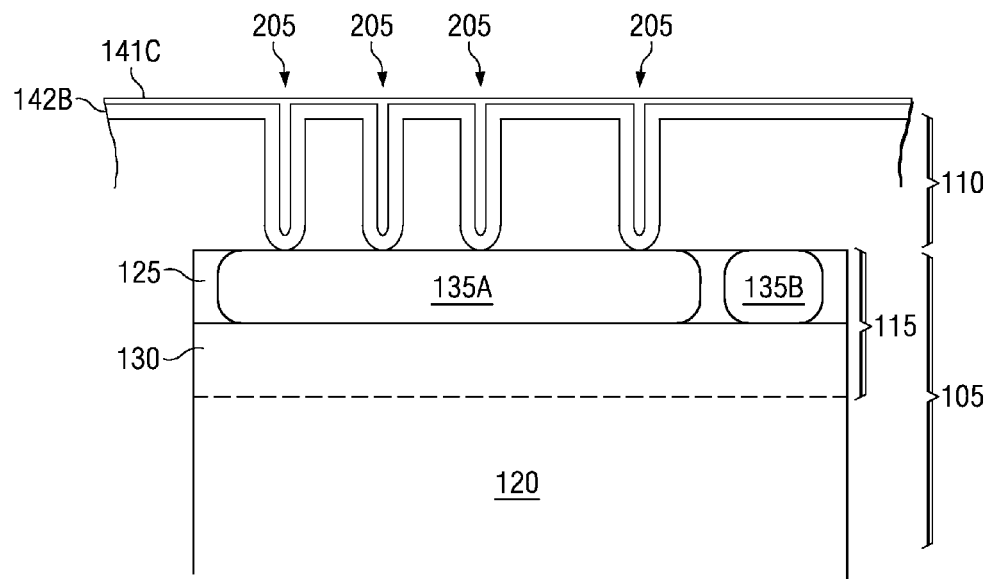
Figure 3E:
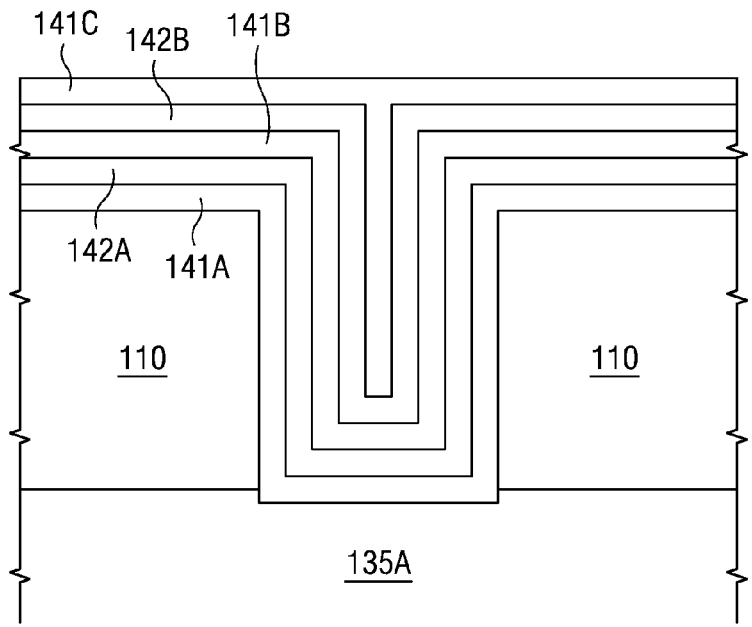
Figure 3F:
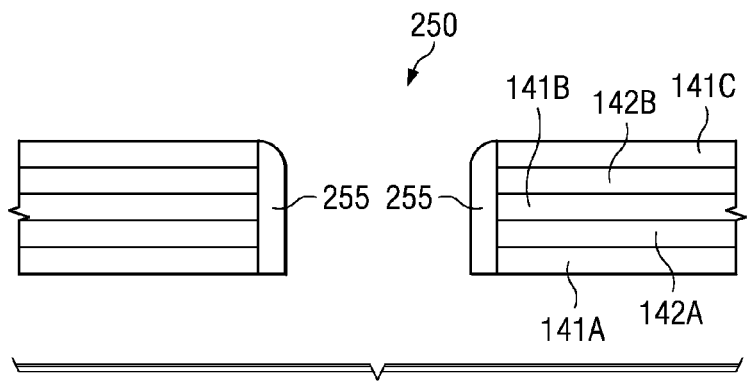

Referring to FIG. 2E, a top electrode layer 141C can then be deposited over the second dielectric layer 142B and formed from a material such as TiN or TaN. The middle electrode layer 141B, first dielectric layer 142A, and the bottom electrode layer 141A have been omitted from FIG. 2E for clarity. For the depicted embodiment, the top electrode layer 141C is deposited to fill the remaining space in the vias 205 so as to form a substantially planar surface at the interface between the top electrode layer 141C and the environment. FIG. 3E depicts an expanded view of via 205 after the deposition of the top electrode layer 141C. The thickness of the top electrode layer 141C can be about 200 Angstroms, as with the previous layers of second dielectric layer 142B, the middle electrode layer 141B, the first dielectric layer 142A, and the bottom electrode layer 141A.

Figure 2F:
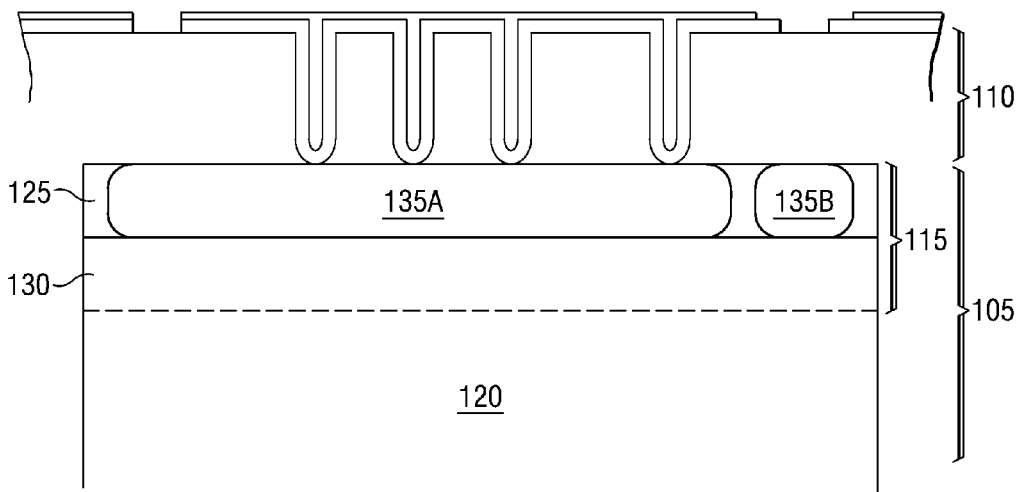

Referring to FIG. 2F, a photoresist with a pattern for the bottom electrode 150 can be formed over the top metal layer 141C. An etching step can remove the metal layers 141A-C and the dielectric layers 142A, B to expose the protective overcoat or the backend dielectric layer 110 underneath the pattern to form a hole for the bottom electrode 150. The same photoresist pattern and etching step can be used to remove the metal layers 141A-C and the dielectric layers 142A, B to form a hole for the middle electrode 160. Subsequently, a second photoresist pattern for the middle electrode 160 can be formed. The second photoresist pattern for the middle electrode 160 has a wider diameter than the first photoresist pattern. An etching step can remove more of the metal layer 141C and dielectric layer 142B to form a stepped hole.

Figure 2G:
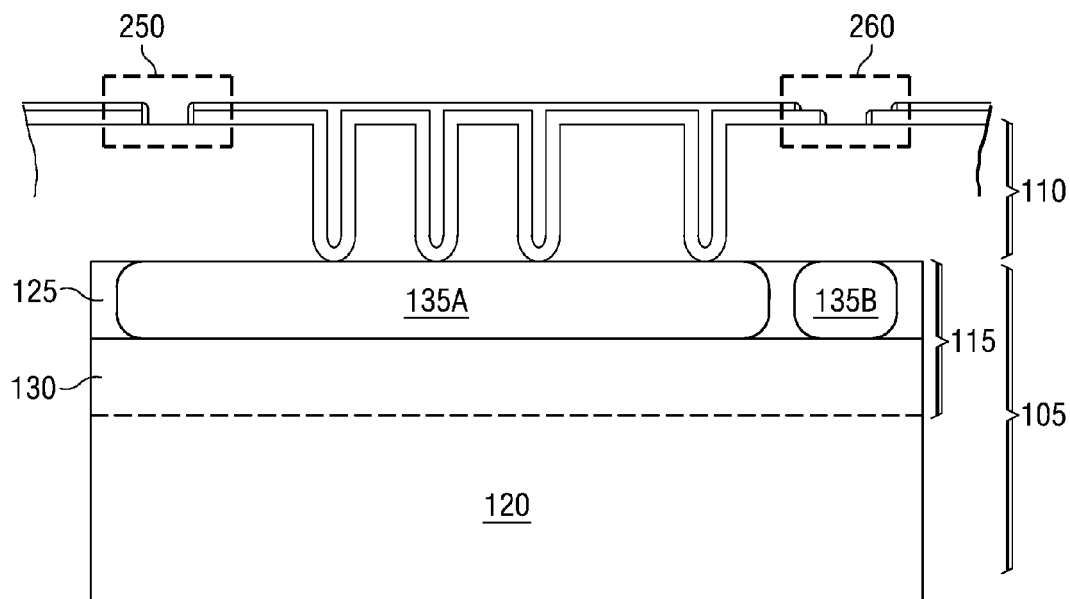

Referring to FIG. 2G, electrical isolation for the bottom electrode 150 and middle electrode 160 can be created to ensure proper operation of the high-k stacked capacitor 100. More particularly, the bottom electrode 150 provides voltage to only the bottom electrode layer 141A, and the middle electrode 160 provides voltage to only the middle electrode layer 141B. Accordingly, insulating sidewalls can be deposited to provide electrical isolation for the electrodes 150, 160. FIG. 2G omits the detail of the bottom, middle, top electrode layers and the first and second dielectric layers for clarity.

Figure 3G:
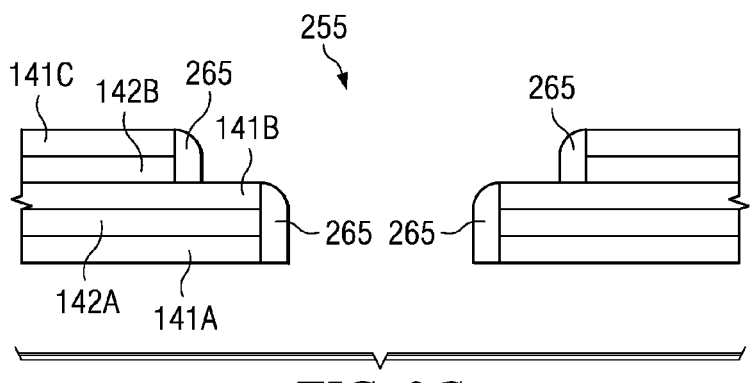

Inset 250 of FIG. 2G (depicted in FIG. 3F) highlights the bottom electrode 150 and shows a more detailed view of the processing for the bottom electrode 150. A photoresist with a pattern for the bottom electrode 150 can be placed over the top electrode layer 141C and etched through the protective overcoat or the backend dielectric layer 110, the electrode layers 141A-C, and dielectric layers 142A, B. Subsequently, inset 250 (FIG. 3F) depicts in a more detailed view insulating sidewalls 255 deposited on the exposed ends of the electrode layers 141A-C and dielectric layers 142A, B Returning to FIG. 2G, similarly, inset 260 (depicted in FIG. 3G) highlights the middle electrode 160, in a more detailed view of the processing for the middle electrode 160. As shown in FIG. 3G, a pattern for the middle electrode 160 can be placed on the top electrode layer 141C and etched. Since the middle electrode layer 141B is sandwiched between the bottom and top electrode layers (141A, 141C, respectively) as well as between the first and second dielectric layers 142A, B, the middle electrode layer 141B has to be electrically isolated from the bottom electrode layer 141A and the first dielectric layer 142A as well as from the top electrode layer 141C and the second dielectric layer 142B. Accordingly, the hole for middle electrode 160 is etched in a step-wise manner to create two steps, i.e., a stepped hole. The first step comprises the top electrode layer 141C and the second dielectric layer 142B. The second step comprises the middle electrode layer 141B, the first dielectric layer 142A, and the bottom electrode layer 141A. Inset 260 (FIG. 3G) shows insulating sidewalls 265 deposited on the sides of the first and second steps.

Figure 2H:
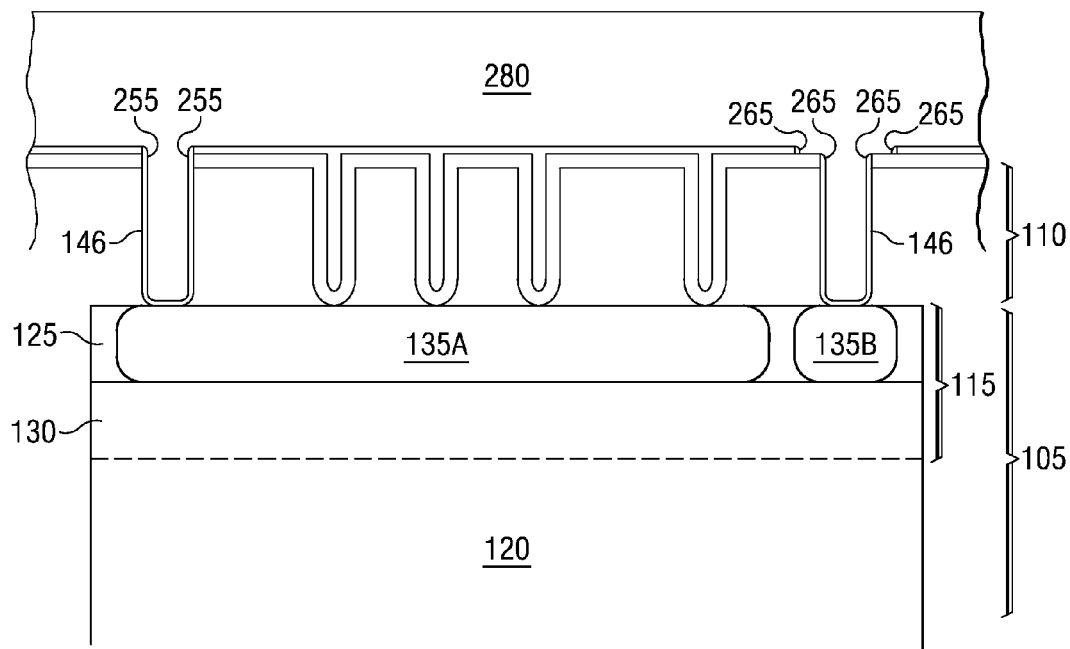

Referring to FIG. 2H, electrode vias 146 can be formed in the protective overcoat or the backend dielectric layer 110 after the insulating sidewalls 255, 265 are grown. Subsequently, a metal can be deposited, which then fills the electrode vias 146 and grows a layer of metal 280 of thickness in the range of 200 Angstroms over the protective overcoat or the backend dielectric layer 110. FIG. 2H omits the detail of the bottom, middle, top electrode layers and the first and second dielectric layers for clarity.

Returning to FIGS. 2G-H, an alternative method for creating the middle electrode 160 can be implemented. More particularly, after the etching to create the stepped hole, an insulating layer can be deposited over the integrated circuit 100. A multi-prong hole pattern can be patterned for the middle electrode 160 as depicted in FIG. 2J. As shown in FIG. 2J, an insulating layer 270 can be deposited or grown over the integrated circuit 100. A multi-prong pattern of small vias 275A, B and a large via 280 can be patterned for the middle electrode 160. The small vias 275A, B can make contact with the middle metal layer 141B while maintaining the insulating layer 270 from metal layer 141C and the dielectric layer 142B. The large via 280 can make contact with the contact node 135B while maintaining the insulating layer 270 between it and the metal layer 141A and the dielectric layer 142A. Subsequently, metal can be deposited to create the middle electrode 160 as previously described.

Figure 2I:
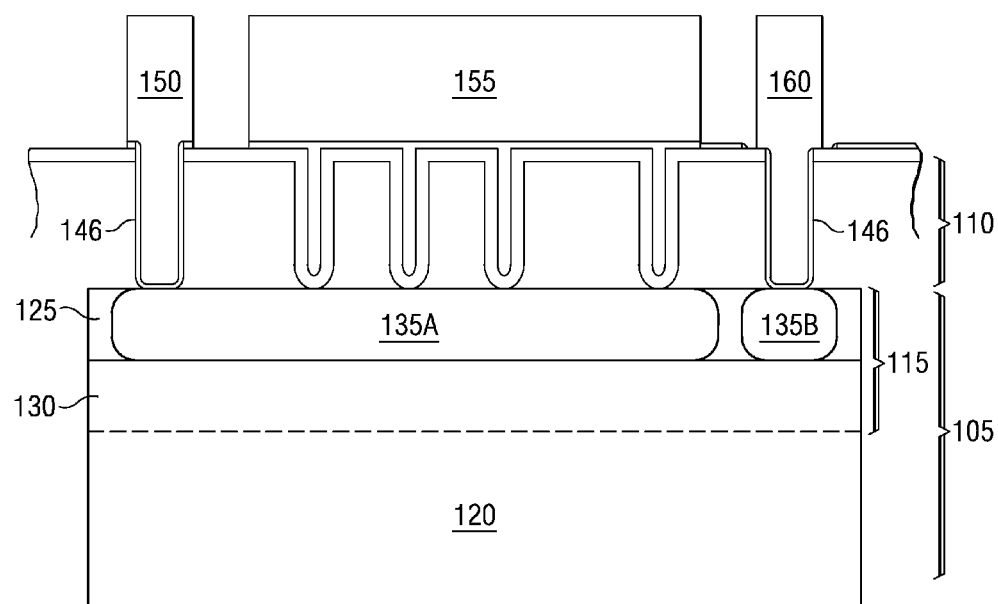
Figure 2J:
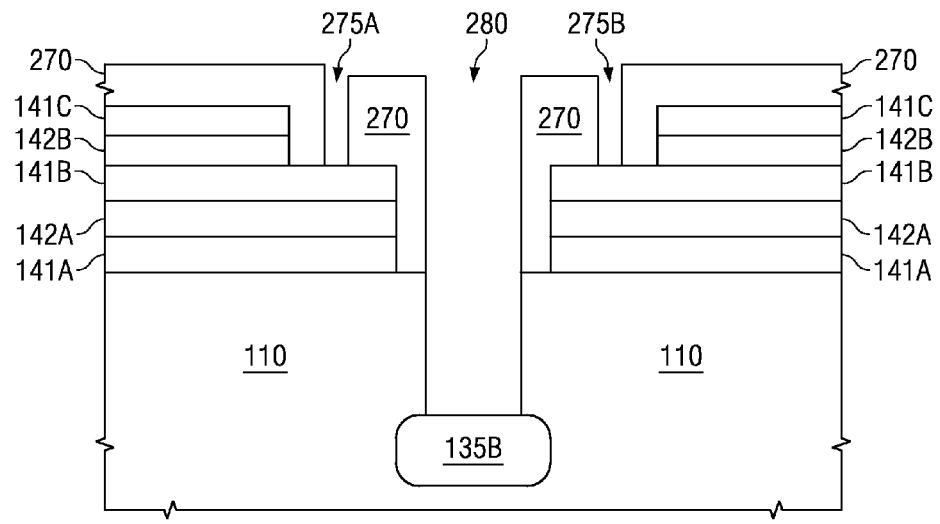

Electrodes 150, 155, 160 can be patterned by masking the metal layer 280 and etching as shown in FIG. 2I. As depicted, the top metal layer 141C surrounding the electrodes 150, 155, 160 has been etched away to electrically isolate the electrodes 150, 155, 160 from each other.

While the invention has been described with reference to example embodiments thereof, those skilled in the art will appreciate that various modifications to the described embodiments may be made without departing from the true spirit and scope of the invention. The terms and descriptions used herein are set forth by way of illustration only and are not meant as limitations. In particular, although the method has been described by way of examples, the steps of the method may be performed in a different order than illustrated or simultaneously. Those skilled in the art will recognize that these and other variations are possible within the spirit and scope of the invention as defined in the following claims and their equivalents.

What is claimed is:

1. A semiconductor device comprising:
   an integrated circuit including a top metal layer; and
   a stacked capacitor formed within a non-conductive volume disposed over the top metal layer and comprising:
      multiple electrode layers conformally disposed within stack holes formed through the non-conductive volume;
      multiple dielectric layers conformally disposed within the stack holes alternately between the multiple electrode layers;
      a first electrode electrically coupled to a bottom layer of the multiple electrode layers and to a first contact node in a top metal layer of the integrated circuit by way of a first electrode via formed through the multiple electrode layers and multiple dielectric layers;
      a second electrode electrically coupled to a middle layer of the multiple electrode layers and to a second contact node in the top metal layer of the integrated circuit by way of a second electrode via formed through the multiple electrode layers and multiple dielectric layers; and
      a third electrode electrically coupled to a top layer of the multiple electrode layers.

2. The device of claim 1, wherein the non-conductive volume is at least one of a protective overcoat layer or a backend dielectric layer.

3. The device of claim 1, wherein the first contact node extends laterally from a position in contact with the first electrode at a bottom of the first electrode via to a position in contact with the bottom layer within at least one stack hole.

4. The device of claim 3, wherein the first electrode contacts a part of a top surface of the top layer which is electrically isolated from laterally adjacent other parts of the top surface of the top layer.

5. The device of claim 4, wherein the first electrode via has an insulating sidewall that electrically isolates the first electrode from ends of the multiple electrode layers and multiple dielectric layers.

6. The device of claim 5, wherein the second electrode contacts a part of a top surface of the middle layer which is not covered by the top layer.

7. The device of claim 6, wherein the second electrode via has an insulating sidewall that electrically isolated the second electrode from ends of the multiple electrode layers and multiple dielectric layers.

8. The device of claim 1, wherein the first electrode contacts a part of a top surface of the top layer which is electrically isolated from laterally adjacent other parts of the top surface of the top layer.

9. The device of claim 8, wherein the first electrode via has an insulating sidewall that electrically isolates the first electrode from ends of the multiple electrode layers and multiple dielectric layers.

10. The device of claim 1, wherein the second electrode contacts a part of a top surface of the middle layer which is not covered by the top layer.

11. The device of claim 10, wherein the second electrode via has an insulating sidewall that electrically isolated the second electrode from ends of the multiple electrode layers and multiple dielectric layers.

12. A semiconductor device comprising:
    an integrated circuit including a top metal layer; and
    a capacitor formed within a non-conductive volume disposed over the top metal layer and comprising:
       multiple electrode layers disposed within a stack hole formed through the non-conductive volume; the multiple electrode layers including a top electrode layer, a middle electrode layer and a bottom electrode layer, with at least the bottom electrode layer in contact with a first contact node in the top metal layer;
       multiple dielectric layers disposed within the stack hole alternately between the multiple electrode layers;
       a first electrode electrically coupled to the first contact node by way of a first electrode via through the middle electrode layer and the bottom electrode layer;
       a second electrode electrically coupled to a second contact node in the top metal layer by way of a second electrode via through the bottom electrode layer; and
       a third electrode electrically coupled to the top electrode layer.

13. The device of claim 12, wherein the first electrode via is a via also through the top electrode layer, and the first electrode contacts a part of a top surface of the top electrode layer which is electrically isolated from laterally adjacent other parts of the top surface of the top electrode layer.

14. The device of claim 13, wherein the second electrode via is a via also through the middle electrode layer, and the second electrode contacts a part of a top surface of the middle electrode layer which is not covered by the top electrode layer.

15. The device of claim 14, wherein the first and second electrode vias have insulating sidewalls that respectively electrically isolate the first and second electrodes from ends of the multiple electrode layers.

16. The device of claim 15, wherein the non-conductive volume comprises a protective overcoat or backend dielectric layer.

17. The device of claim 12, wherein the second electrode via is a via also through the middle electrode layer, and the second electrode contacts a part of a top surface of the middle electrode layer which is not covered by the top electrode layer.

18. The device of claim 12, wherein the non-conductive volume comprises a protective overcoat or backend dielectric layer.

* * * * *